United States Patent [19]

Roser

[11] Patent Number: 5,380,622
[45] Date of Patent: Jan. 10, 1995

[54] PRODUCTION OF NEGATIVE RELIEF COPIES

[75] Inventor: Joachim Roser, Ludwigshafen, Germany

[73] Assignee: BASF Aktiengesellschaft, Ludwigshafen, Germany

[21] Appl. No.: 688,406

[22] Filed: Apr. 22, 1991

[30] Foreign Application Priority Data

Apr. 27, 1990 [DE] Germany .............................. 4013575

[51] Int. Cl.$^6$ ........................ G03F 7/023; G03F 7/30
[52] U.S. Cl. ..................................... 430/325; 430/165; 430/190; 430/191; 430/192; 430/193; 430/302; 430/328; 430/330
[58] Field of Search ............... 430/325, 330, 192, 191, 430/193, 190, 328, 302

[56] References Cited

U.S. PATENT DOCUMENTS

| | | | |
|---|---|---|---|
| 4,308,368 | 12/1981 | Kubo et al. | 525/504 |
| 4,356,254 | 10/1982 | Takahashi et al. | 430/190 |
| 4,504,567 | 3/1985 | Yamamoto et al. | 430/165 |
| 4,576,901 | 3/1986 | Stahlhofen et al. | 430/325 |
| 4,581,321 | 4/1986 | Stahlhofen | 430/325 |
| 4,696,891 | 9/1987 | Guzzi | 430/325 |
| 4,797,346 | 1/1989 | Yamamoto et al. | 430/192 |
| 4,863,829 | 9/1989 | Furuta et al. | 430/192 |
| 4,885,232 | 12/1989 | Spak | 430/192 |
| 4,889,788 | 12/1989 | Stahlhofen et al. | 430/191 |
| 4,927,732 | 5/1990 | Merrem et al. | 430/192 |
| 5,110,706 | 5/1992 | Yumoto et al. | 430/192 |

FOREIGN PATENT DOCUMENTS 1494640 4/1979 United Kingdom .
1492620 7/1981 United Kingdom .

Primary Examiner—Charles L. Bowers, Jr.
Assistant Examiner—John S. Chu
Attorney, Agent, or Firm—Keil & Weinkauf

[57] ABSTRACT

Negative relief copies are produced by imagewise exposure of a recording plate consisting of a substrate and a photosensitive layer which is applied thereon and contains, as photosensitive compounds, esters of 1,2-naphthoquinone-2-diazide-4- and/or -5-sulfonic acid or -carboxylic acid, heating of the exposed plate, uniform exposure of the plate and development of the relief copy by dissolving the alkali-soluble components from the recording layer by means of an aqueous alkaline developer, by a process in which the photosensitive layer of the recording plate contains a reaction product of a) from 50 to 99% by weight of an oligomeric or polymeric condensate of
  $a_1$) from 0.5 to 1 mol of an alkyl- and/or alkoxy-substituted monohydric, dihydric or trihydric hydroxybenzene,
  $a_2$) from 0 to 0.5 mol of phenol and
  $a_3$) from 0.5 to 1.5 mol of a $C_1$–$C_{12}$-carbonyl compound, the sum of the amounts of $a_1$) and $a_2$) being 1 mol, and
b) from 1 to 50% by weight of 1,2-naphthoquinone-2-diazide-4-sulfonic acid or -carboxylic acid or a functional derivative of these acids, where up to 20% by weight of these compounds may be replaced with the corresponding esters of the 5-sulfonic or -carboxylic acid.

4 Claims, No Drawings

PRODUCTION OF NEGATIVE RELIEF COPIES

The present invention relates to an improved process for the production of negative relief copies by imagewise exposure of a recording plate consisting of a substrate and a photosensitive layer which is applied thereon and' contains, as photosensitive compounds, esters of 1,2-naphthoquinone-2-diazide-4- and/or -5-sulfonic acid or -carboxylic acid, heating of the exposed plate, uniform exposure of the plate and development of the relief copy by dissolving the alkali-soluble components from the recording layer by means of an aqueous alkaline developer.

Printing plates which contain esters of 1,2-naphthoquinone-2-diazide-4- and/or -5-sulfonic acid or -carboxylic acid as photosensitive compounds are generally known, for example from DE-A 33 25 023.

During exposure of the photosensitive layer, the 1,2-naphthoquinone-2-diazide-4-sulfonic esters are converted into the indenecarboxylic acid derivatives:

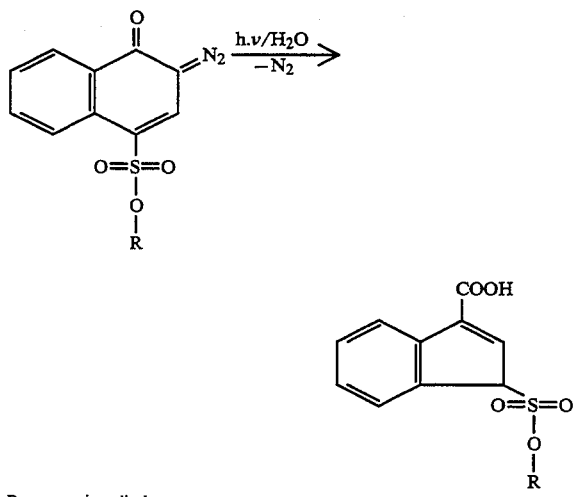

R = organic radical

As a result, these photosensitive compounds become water-soluble and can be washed out from the exposed parts during development, together with the binders which are soluble in aqueous alkaline solutions. The alumina layer of the substrate is thus bared in these parts, which accept the water of the emulsion consisting of water and printing ink, whereas the printing ink wets the remaining organic layer.

In an important variant of the production of such printing plates, positive-working photosensitive layers based on 1,2-naphthoquinonediazides are processed by a negative procedure involving a certain sequence of treatment steps. In this reverse process, the printing plate is first heated after the imagewise exposure, decarboxylation of the indenecarboxylic acid derivative formed in the exposure step taking place, and is then again exposed, but uniformly, i.e. without an image-bearing transparency. Development in an aqueous alkaline medium is then carried out, the parts exposed imagewise in the first exposure step remaining and the other parts of the layer being washed out.

Desirable recording plates are those which can alternatively be processed to give a positive or negative copy of an image-bearing transparency, so that the two procedures can be combined on one and the same printing plate in a photocomposing process.

Such reversible copying layers based on 5-substituted derivatives of 1,2-naphthoquinone-2-diazides which contain hydroxyl- or amino-containing additives for curing the negative layer formed in the heating step are disclosed in, for example, DE-A 24 61 912 and GB-A 1 492 620. However, these additives have a disadvantageous effect on the shelf life of the copying layers and on certain copying characteristics, for example the photosensitivity and the image contrast after exposure.

To avoid such disadvantages, DE-A 33 25 023 recommends 1,2-naphthoquinone-2-diazide-4-sulfonic esters or -4-carboxylic esters since with these, in contrast to the derivatives functionalized in the 5-position, the exposed parts of the layer are completely cured at elevated temperatures, even without additives, and hence become insoluble in the developer.

Monomers, e.g. 2,3,4-trihydroxybenzophenone and 4-(2-phenylprop-2-yl)-phenol, or polymers, such as phenol/aldehyde or phenol/acetone condensates, were proposed as corresponding alcohol components.

However, the use of the polymeric esters based on phenol resins is also not completely satisfactory with regard to the required properties of the printing plates obtainable therefrom. Thus, the requirement for a balanced relationship between long press life and good mechanical stability of the layer and sufficiently high resolution of the negative copy in conjunction with a large tonal value transfer range and in particular good developability is not sufficiently fulfilled by good washout characteristics.

It is an object of the present invention to provide photosensitive reaction products which are more suitable than the conventional compounds for the production of reversible printing plates having optimum requirement profiles.

We have found that this object is achieved by an improved process for the production of negative relief copies by imagewise exposure of a recording plate consisting of a substrate and a photosensitive layer which is applied thereon and contains, as photosensitive compounds, esters of 1,2-naphthoquinone-2-diazide-4- and/or -5-sulfonic acid or -carboxylic acid, heating of the exposed plate, uniform exposure of the plate and development of the relief copy by dissolving the alkali-soluble components from the recording layer by means of an aqueous alkaline developer, in which the photosensitive layer of the recording plate contains a reaction product of a) from 50 to 99% by weight of an oligomeric or polymeric condensate of
   $a_1$) from 0.5 to 1 mol of an alkyl- and/or alkoxy-substituted monohydric, dihydric or trihydric hydroxybenzene,
   $a_2$) from 0 to 0.5 mol of phenol and
   $a_3$) from 0.5 to 1.5 mol of a $C_1$-$C_{12}$-carbonyl compound,
   the sum of the amounts of $a_1$) and $a_2$) being 1 mol, and
b) from 1 to 50% by weight of 1,2-naphthoquinone-2-diazide-4-sulfonic acid or -carboxylic acid or a functional derivative of these acids, where up to 20% by weight of these compounds may be replaced with the corresponding esters of the 5-sulfonic or -carboxylic acid.

We have also found novel photosensitive recording materials.

The reaction products to be used according to the invention contain from 50 to 99% by weight of an oligomeric or polymeric condensate as component a) and from 1 to 50% by weight of 1,2-naphthoquinone-2-diazide-4-sulfonic acid or -carboxylic acid or a functional derivative of these acids as component b), where up to 20% by weight of these compounds may be replaced with the corresponding esters of 5-sulfonic or -carboxylic acid.

Component a) in turn consists of from 0.5 to 1 mol of an alkyl- and/or alkoxy-substituted monohydric, dihydric or trihydric hydroxybenzene as component $a_1$) and from 0.5 to 1.5, preferably from 0.8 to 1.2, mol of a carbonyl compound, in particular a $C_1$–$C_{12}$-carbonyl compound, as component $a_3$).

The condensate a) may furthermore contain up to 0.5 mol of phenol as component $a_2$), the sum of the amounts of components $a_1$) and $a_2$) being 1 mol.

Suitable components $a_1$) are alkyl- and/or alkoxy-substituted monohydric, dihydric or trihydric hydroxybenzenes, the number of carbon atoms in each of these substituents preferably being from 1 to 12. Particularly preferred components $a_1$) are p-cresol and p-tert-butylphenol. m-Cresol, 4-octylphenol, m-methoxyphenol, p-methoxyphenol, m-butoxyphenol and p-butoxyphenyl are particularly preferred. Resorcinol, pyrogallol, pyrogallol monomethyl ether and pyrogallol dimethyl ether are also suitable.

Particularly suitable components $a_3$) are $C_1$–$C_{12}$-carbonyl compounds. Particularly good results are obtained with formaldehyde. Benzaldehyde, acetaldehyde and isobutyraldehyde are preferred. Other examples are acetone and acetophenone.

Suitable components b) are 1,2-naphthoquinone-2-diazide-4-sulfonic acid and -carboxylic acid and functional derivatives of these acids, where up to 20% by weight of these compounds may be replaced with the corresponding esters of 5-sulfonic or -carboxylic acid.

Suitable functional acid derivatives are amides and halides, in particular chlorides.

In addition to the reaction products to be used according to the invention, the photosensitive recording layers contain polymeric, water-insoluble, resin-like binders which are soluble in aqueous alkaline solutions.

Novolak condensates of formaldehyde with phenol, m-cresol and p-cresol are particularly preferred. Condensation resins of formaldehyde with p-methoxyphenol, 4-octylphenol or p-tert-butylphenol and phenol and/or cresol are further preferred components. Other examples are condensates of acetaldehyde, isobutyraldehyde or benzaldehyde with phenol, m-cresol and p-cresol.

The novolaks can be modified in a known manner by reacting some of their hydroxyl groups with, for example, chloroacetic acid, isocyanates, epoxides or carboxylic anhydrides.

Other suitable binders are polyhydroxyphenol resins which are prepared by condensation of phenols with aldehydes or ketones, copolymers of styrene and maleic anhydride, polyvinylphenols and copolymers of acrylic acid or methacrylic acid, in particular with $C_1$–$C_{12}$-alkyl acrylates or methacrylates.

The binders to be used preferably have a softening point from 90° to 160° C. and are employed in general in amounts of from 15 to 95, preferably from 50 to 80, % by weight, based on the total solids content of the layer.

In addition to the photosensitive reaction products and the binders, the recording layers may also contain assistants.

For example, additional resins for adjustment to specific developers may be present, preferably epoxy resins and homo- and copolymers of vinyl acetate, of N-vinylpyrrolidone, of acrylates, of vinylacetals and of vinyl ethers.

These resins are advantageously used in amounts of from 0.1 to 10% by weight, based on the total solids content of the layer.

The photosensitive recording layers may furthermore contain monomeric or polymeric 1,2-naphthoquinone-2-diazide-5-sulfonic esters for improving various processing properties in the copy or during printing, for example for improving the transferrable tonal value range in the copy or the ink acceptance and free running behavior.

Monomeric esterification products of 1,2-naphthoquinone-2-diazide-5-sulfonyl chloride with 2,5-di-tert-butyl-4-methylphenol, 4-methylphenol or phenol and the polymeric esterification product with a 4-octylphenol/formaldehyde condensate are preferred.

In general, these esters are used in amounts of from 0.05 to 15% by weight, based on the total solids content of the layer.

Dyes, for example azo, anthraquinone, cyanine or phthalocyanine dyes, in particular acid-sensitive or photosensitive dyes, for example triphenylmethane dyes or azobenzene derivatives, may also be added to the photo-sensitive layer.

When acid-sensitive dyes are used, it is possible to add photochemical acid donors which, on exposure, preferably form or eliminate strong acids and produce a color change in a secondary reaction with the dye.

The presence of a color change system allows the copy to be checked on the basis of the appearance of the resulting latent image.

The dyes are advantageously used in amounts of from 0.05 to 5% by weight.

Suitable photochemical acid donors are chomophore-substituted halomethyl derivatives of triazine, of oxadiazole and of thiadiazole and aryldiazonium salts, arylsulfonium salts and aryliodonium salts.

2-(4-Methoxyphenyl)-4,6-bis-trichloromethyl-1,3,5-triazine, 2-(4-methoxynaphth-1-yl)-4,6-bis-trichloromethyl-1,3,5-triazine, 2-trichloromethyl-5-($\beta$-(2'-benzofuranyl)-vinyl)-1,3,4-oxadiazole, 4-phenylaminobenzenediazonium tetrafluoroborate and 4-(4'-methylphenylthio)-2,5-diethoxybenzenediazonium hexafluorophosphate are particularly preferred.

In general, the photochemical acid donors are used in amounts of from 0.05 to 5% by weight, based on the total solids content of the layer.

The layers may also contain assistants for improving the developability, such as carboxylic hydrides, and phosphoric and phosphonic acid derivatives.

Glutaric anhydride is particularly preferred and is used in amounts of from 0.05 to 5% by weight, based on the total solids content of the layer.

To coat a substrate, the photosensitive layer is dissolved in a solvent, from 5 to 35% strength solutions preferably being prepared.

Suitable solvents are ketones, such as methyl ethyl ketone, chlorohydrocarbons, such as trichloroethylene and 1,1,1-trichloroethane, alcohols, such as n-propanol, ethers, such as tetrahydrofuran, alcohol ethers, such as ethylene glycol monoethyl ether, esters, such as butyl acetate, and lactones, such as butyrolactone, and mixtures of these solvents.

Ethylene glycol monomethyl ether and propylene glycol monomethyl ether and mixtures of these with acetone are particularly preferred.

The substrates used for the photosensitive layer are bright rolled, mechanically or electrochemically roughened, anodized aluminum sheets which may furthermore be pretreated chemically with hydrophilizing aqueous solutions, for example with polyvinylphosphonic acid, silicates, phosphates, hexafluorozirconates or hydrolyzed tetraethyl orthosilicate.

The substrate is coated in a conventional manner by spin coating, spraying, immersion or roller coating, and coating is carried out so that a layer weight of from 1.0 to 3.5 $g/m_2$ results after drying to a residual solvent content of less than 5% by weight.

Aqueous solutions of alkaline substances, for example of alkali metal phosphates, silicates, carbonates or hydroxides, are used for development.

2–5% strength aqueous alkaline sodium silicate solutions are particularly preferred.

Very particularly important photosensitive recording materials are those in which the oligomeric or polymeric condensate a), which is firmly anchored by ester formation with 1,2-naphthoquinone-2-diazide compound, additionally assumes the function of the binder. These recording materials are novel. As a result of the choice of this ester component a), the addition of a separate binder is possible but no longer necessary.

In the process for the production of negative relief copies, as a rule the recording plate is exposed imagewise, heated, cooled, exposed again, but uniformly and without an image-bearing transparency, and then developed in an aqueous alkaline developer.

Exposure may be effected using various radiation sources, for example UV, metal halide, xenon or arc lamps. The exposure times for imagewise exposure are usually from 5 to 150, generally from 30 to 80, seconds.

The subsequent heating is usually carried out at from 80° to 160° C., preferably from 110° to 150° C. The duration of heating is in general from 0.5 to 10 minutes. It may be effected, for example, by radiation, convection, contact with heated surfaces, such as rollers, or immersion in a heated bath of an inert liquid.

After the plate has been cooled, it is subjected to uniformexposure, the exposure time usually being from 30 to 80 seconds.

This postexposure can preferably be carried out under the light source used for imagewise exposure.

The aqueous alkaline development can be effected immediately after the postexposure or, for example, several hours thereafter.

The combination of this process for the production of negative copies with the process for the production of positive copies on one and the same printing plate by the photocomposing process is economically very advantageous.

For this purpose, for example, one half of the plate is covered and the other half is exposed imagewise through a photographic positive and heated, the previously covered half is then exposed imagewise, the previously uncovered half is exposed uniformly and finally development is carried out in an aqueous alkaline developer.

The printing plates obtained by this photocomposing process have the negative copy of the image-bearing transparency on the first imagewise exposed half of the plate and the positive copy on the other half.

The novel process can be used for the production of printing plates for letterpress, gravure and lithographic printing and of photoresist templates for the production of printed circuit boards.

The reaction products to be used according to the invention and the printing plates obtainable therefrom are very suitable for the alternative production of positive or negative copies.

EXAMPLES

Production of negative relief copies

A 10% strength solution of a mixture of
  a binder or binder mixture B,
  one or more 4-sulfonic esters of 1,2-naphthoquinone-2-diazide E-4,
  one or more 5-sulfonic esters of 1,2-naphthoquinone-2-diazide E-5,
  a radiation-sensitive dye system consisting of one or more dyes F and
  one or more acid donors S and assistants H,
in the amounts stated in the table, in a solvent L was applied to an electrolytically roughened and anodized aluminum substrate in a layer weight of from 1.6 to 2.5 $g/m^2$. The plate was exposed imagewise through a photographic positive which contained precision measuring strips (FOGRA measuring strip PMS-I, UGRA offset test wedge 1982) for the duration of from 10 to 112 seconds using a 5.5 kW metal halide lamp at a distance of about 70 cm from the lamp. Heating was then carried out for 90 seconds at from 125° to 145° C., followed by uniform exposure for from 30 to 80 seconds through a transparent film. Finally, development was carried out with a 2–5% strength aqueous alkaline sodium silicate solution at from 15° to 30° C.

The printing plates obtained had the negative copy of the image-bearing transparency.

The copies of the FOGRA test strips were evaluated in a conventional manner by the method described in FOGRA-Praxis-Report No. 34, Munich 1985.

In all cases, satisfactory offset prints were obtained with the printing plates produced in this manner.

The details of the experiments are shown in the table below.

Meaning of the abbreviations in the table

Binders B

B/1 Phenol/p-cresol/m-cresol-formaldehyde condensate, softening point 120.5° C. according to DIN 52,011

B/2 p-Methoxyphenol-formaldehyde condensate, softening point 134° C. according to DIN 52,011

B/3 Phenol/4-octylphenol-formaldehyde condensate, softening point 104° C. according to DIN 52,011

B/4 Phenol/cresol/p-methoxyphenol/formaldehyde condensate, softening point 157° C. according to DIN 52,011

B/5 Phenol/p-cresol/m-cresol-acetaldehyde condensate, softening point 92° C., according to DIN 52,011

B/6 Phenol/p-cresol/m-cresol-isobutyraldehyde condensate, softening point 123.5° C. according to DIN 52,011

B/7 Phenol/p-cresol/m-cresol-benzaldehyde condensate, softening point 142.5° C. according to DIN 52,011

B/8 Phenol/cresol/p-tert-butylphenol-formaldehyde condensate, softening point 100° C. according to DIN 52,011

B/9 Phenol/p-methoxyphenol-formaldehyde condensate, softening point 117° C. according to DIN 52,011

B/10 p-Cresol-formaldehyde condensate, softening point 92° C. according to DIN 52,011

Esters E-4

E-4/1 Esterification product of 1,2-naphthoquinone-2-diazide-4-sulfonyl chloride and a p-cresol-formaldehyde condensate, softening point 160° C.

E-4/2 Esterification product of 1,2-naphthoquinone-2-diazide-4-sulfonyl chloride and a p-tert-butylphenol-formaldehyde condensate, softening point 130° C.

E-4/3 Esterification product of 1,2-naphthoquinone-2-diazide-4-sulfonyl chloride and a phenol/cresol/tert-butylphenol-formaldehyde condensate, softening point 125° C.

E-4/4 Esterification product of 1,2-naphthoquinone-2-diazide-4-sulfonyl chloride and a phenol/m-cresol/p-cresol-benzaldehyde condensate, softening point 135° C.

Esters E-5

E-5/1 2,5-Di-tert-butyl-4-methylphenyl 1,2-naphthoquinone- 2-diazide-5-sulfonate E-5/2 Esterification product of 1,2-naphthoquinone-2-diazide-5-sulfonyl chloride and a 4-octylphenol-formaldehyde condensate having a softening point of from 80° to 85° C.

E-5/3 4-Methylphenyl 1,2-naphthoquinone-2-diazide-5-sulfonate

E-5/4 Phenyl 1,2-naphthoquinone-2-diazide-5-sulfonate

Dyes F

F/1-F/4 are triphenylmethane dyes (C.I.=Colour Index)

F/1=Flexo violet 615, C.I. 42,555

F/2=Basonyl violet 600, C.I. 42,535

F/3=Basonyl blue 639, C.I. 42,595

F/4=Crystal violet F10B, C.I. 42,557

F/5=Diethylaminoazobenzene (photosensitive)

Acid donors S

S/1=2-Trichloromethyl-5-($\beta$-(2'-benzofuranyl)-vinyl)-1,3,4-oxadiazole

S/2=2-(4-Methoxyphenyl)-4,6-bis-trichloromethyl-1,3,5-triazine

S/3=2-(4-Methoxynaphth-1-yl)-4,6-bis-trichloromethyl-1,3,5-triazine

S/4=4-Phenylaminobenzenediazonium tetrafluoroborate

S/5=4-(4'-Methylphenylthio)-2,5-diethoxybenzenediazonium hexafluorophosphate

Assistants H

H/1=Glutaric anhydride (for improving the developability)

Solvents L

L/1 Ethylene glycol monomethyl ether

L/2 Acetone/propylene glycol monomethyl ether (1:4)

L/3 Propylene glycol monomethyl ether

L/4 Acetone/propylene glycol monomethyl ether (1:1).

TABLE

| Example No. | Binder B Amount [g] | Ester E-4 Amount [g] | Ester E-5 Amount [g] | Dye F Amount [g] | Acid donor S Amount [g] | Assistant H Amount [g] | Solvent L |
|---|---|---|---|---|---|---|---|
| 1 | B/1 74 | E-4/1 22 | E-5/1 0.95 E-5/2 0.95 | F/1 1 | S/1 0.60 | H/1 0.50 | L/1 |
| 2 | B/1 57 B/2 15 | E-4/1 21 | E-5/1 1.30 E-5/2 1 | F/2 1.40 | S/2 1.90 S/5 1.40 | — | L/2 |
| 3 | B/1 74 | E-4/1 22 | E-5/2 1.40 | F/1 1 | S/3 0.60 S/1 1.40 | H/1 0.40 | L/2 |
| 4 | B/1 71 | E-4/1 20 | E-5/1 1.40 E-5/2 1 | F/2 1.40 | S/1 1.80 S/5 1.40 | H/1 2 | L/1 |
| 5 | B/1 57 B/3 15 | E-4/1 21 | E-5/1 1.30 E-5/2 1 | F/2 1.40 | S/1 1.90 S/5 1.40 | — | L/1 |
| 6 | B/1 72.75 | E-4/1 17 E-4/2 9 | — | F/3 0.50 F/5 0.75 | — | — | L/3 |
| 7 | B/4 75.40 | E-4/1 18 E-4/2 4 | E-5/1 1 | F/1 1 | S/1 0.60 | — | L/3 |
| 8 | B/4 74 | E-4/1 20 E-4/2 2.95 | E-5/3 0.95 | F/1 1 | S/1 0.60 | — | L/3 |
| 9 | B/1 60 B/5 13 | E-4/1 20 | E-5/2 1.20 E-5/4 1.20 | F/2 1.30 | S/1 1.40 S/5 1.10 | H/1 0.80 | L/4 |
| 10 | B/1 49 B/6 20 | E-4/1 25 E-4/2 3.50 | — | F/1 1 | S/2 0.80 | H/1 0.70 | L/4 |
| 11 | B/7 61 | E-4/1 35 | E-5/1 1 E-5/2 1 | F/1 1 | S/1 0.60 | H/1 0.40 | L/3 |
| 12 | B/7 53 B/8 21 | E-4/1 21 E-4/2 1.50 | B-5/1 1 | F/1 1 | S/2 0.80 | H/1 0.70 | L/2 |
| 13 | B/4 37 B/7 37 | E-4/1 20 E-4/2 2.95 | E-5/1 0.95 | F/1 1 | S/1 0.80 | — | L/2 |
| 14 | B/7 55.50 B/9 18.50 | E-4/1 20 E-4/2 3 | E-5/3 1 | F/1 1 | S/1 0.60 | H/1 0.40 | L/2 |
| 15 | B/7 37 B/10 37 | E-4/1 20 E-4/2 3 | B-5/1 1 | F/1 1 | S/1 0.60 | H/1 0.40 | L/2 |
| 16 | B/4 16.25 B/7 50 | E-4/1 16.25 E-4/2 16.25 | — | F/1 0.40 F/3 0.20 | S/2 0.65 | — | L/2 |
| 17 | B/1 80 | E-4/2 18 | — | F/3 0.33 F/4 0.67 | S/1 1.80 | — | L/4 |
| 18 | — | E-4/3 96 | — | F/1 1 | S/2 2 | — | L/2 |

TABLE-continued

| Example No. | Binder B Amount [g] | Ester E-4 Amount [g] | Ester E-5 Amount [g] | Radiation sensitive dye system | | | Solvent L |
| --- | --- | --- | --- | --- | --- | --- | --- |
| | | | | Dye F Amount [g] | Acid donor S Amount [g] | Assistant H Amount [g] | |
| 19 | — | E-4/4 94 | E-5/1 1<br>E-5/2 1.20 | F/3 1<br>F/1 1.70 | S/1 1.50 | H/1 0.60 | L/2 |
| 20 | B/7 10 | E-4/3 88 | — | F/1 1.10 | S/1 0.60 | H/1 0.30 | L/2 |
| 21 | B/4 10 | E-4/3 88 | — | F/1 1.10 | S/1 0.60 | H/1 0.30 | L/2 |
| 22 | B/1 10 | E-4/4 85.30 | — | F/2 1.60 | S/2 1.70<br>S/5 1.40 | — | L/2 |

We claim:

1. A process for the production of negative copies by imagewise exposure of a recording plate consisting of a substrate and a photosensitive layer which is applied thereon and consists essentially of,
   as photosensitive compounds, ester of 1,2-naphthoquinone-2-diazide-4-sulfonic acid-4- and -5-sulfonic acid or -4-sulfonic acid and 5-carboxylic acid, polymeric, water-insoluble, resin-like binders which are soluble in aqueous alkaline solutions,
and optionally at least one assistant from the group consisting of resins for adjustment to specific developers, monomeric 1,2-naphthoquinone-2-diazide-5-sulfonic esters, dyes and assistants for improving the developability, which comprises heating of the exposed plate, uniform exposure of the plate and development by dissolving the alkali-soluble components from the recording layer by means of an aqueous alkaline developer to form said negative relief copies, wherein said esters are obtained by reacting a) from 50 to 99% by weight of an oligomeric or polymeric condensate of
   $a_1$) from 0.5 to 1 mol of an alkyl- and/or alkoxy substituted monohydric, dihydric or trihydric hydroxybenzene,
   $a_2$) from 0 to 0.5 mol of phenol and
   $a_3$) from 0.5 to 1.5 mol of a $C_1$-$C_{12}$-carbonyl compound, the sum of the amounts of $a_1$ and $a_2$ being 1 mol, and
b) from 1 to 50% by weight of 1,2-naphthoquinone-2-diazide-4-sulfonic acid or -carboxylic acid or a functional derivative of these acids,
where up to 20% by weight of said compounds b) is optionally replaced by the corresponding 5-sulfonic or -carboxylic acid or a functional derivative of these acids.

2. A process as defined in claim 1, wherein component $a_1$) is p-cresol or p-tert-butylphenol.

3. A process as defined in claim 1, wherein component $a_3$) is formaldehyde.

4. A process as defined in claim 1, wherein the amount of component $a_3$) is from 0.8 to 1.2 mol.

* * * * *